(12) United States Patent
Sakurayama (10) Patent No.: US 11,778,798 B2
(45) Date of Patent: Oct. 3, 2023

(54) INFORMATION PROCESSING DEVICE, WORK SYSTEM, AND DETERMINATION METHOD

(71) Applicant: FUJI CORPORATION, Chiryu (JP)

(72) Inventor: Takeshi Sakurayama, Nisshin (JP)

(73) Assignee: FUJI CORPORATION, Chiryu (JP)

( * ) Notice: Subject to any disclaimer, the term of this patent is extended or adjusted under 35 U.S.C. 154(b) by 249 days.

(21) Appl. No.: 17/257,928

(22) PCT Filed: Jul. 24, 2018

(86) PCT No.: PCT/JP2018/027624
§ 371 (c)(1),
(2) Date: Jan. 5, 2021

(87) PCT Pub. No.: WO2020/021618
PCT Pub. Date: Jan. 30, 2020

(65) Prior Publication Data
US 2021/0153399 A1      May 20, 2021

(51) Int. Cl.
*H05K 13/04* (2006.01)
*H05K 13/02* (2006.01)

(52) U.S. Cl.
CPC ......... *H05K 13/0413* (2013.01); *H05K 13/02* (2013.01); *H05K 13/0408* (2013.01); *H05K 13/0419* (2018.08)

(58) Field of Classification Search
CPC ............... H05K 13/0413; H05K 13/02; H05K 13/0408; H05K 13/0419
See application file for complete search history.

(56) References Cited

U.S. PATENT DOCUMENTS

| 2004/0098857 A1* | 5/2004 | Kawada | H05K 13/0452 |
| | | | 29/739 |
| 2005/0096781 A1* | 5/2005 | Sumida | H05K 9/0016 |
| | | | 700/213 |
| 2014/0171769 A1 | 6/2014 | Ochs et al. | |

(Continued)

FOREIGN PATENT DOCUMENTS

| JP | 2005005288 A | * | 1/2005 | .......... H05K 13/022 |
| JP | 2010073929 A | * | 4/2010 | |

(Continued)

OTHER PUBLICATIONS

International Search Report dated Oct. 23, 2018 in PCT/JP2018/027624 filed on Jul. 24, 2018.

*Primary Examiner* — Peter Dungba Vo
*Assistant Examiner* — Jose K Abraham
(74) *Attorney, Agent, or Firm* — Oblon, McClelland, Maier & Neustadt, L.L.P.

(57) ABSTRACT

An information processing device configured to determine a mounting position of a tape feeder to any one of multiple feeder mounting sections formed in a work machine, in which mounting positions of two or more tape feeders configured to supply components of holding target held by two or more holding tools of a work head disposed in the work machine are determined to any one of the multiple feeder mounting sections based on position information indicating supply positions of the two or more tape feeders, so that a difference in an amount of deviation of the supply positions of the two or more tape feeders is within a predetermined range.

9 Claims, 7 Drawing Sheets

(56) References Cited

U.S. PATENT DOCUMENTS

| | | | | |
|---|---|---|---|---|
| 2015/0212503 | A1* | 7/2015 | Shimizu | H05K 13/086 |
| | | | | 235/375 |
| 2016/0205820 | A1* | 7/2016 | Ohashi | H05K 13/0417 |
| | | | | 29/739 |
| 2016/0366797 | A1* | 12/2016 | Sumi | H05K 13/0857 |
| 2017/0049013 | A1* | 2/2017 | Kanai | H05K 13/08 |
| 2017/0257991 | A1* | 9/2017 | Watanabe | H05K 13/0812 |

FOREIGN PATENT DOCUMENTS

| | | | |
|---|---|---|---|
| JP | 2013-73997 A | 4/2013 | |
| JP | 2017-188608 A | 10/2017 | |
| WO | WO 2014/100084 A1 | 6/2014 | |
| WO | WO-2016170637 A1 * | 10/2016 | H05K 13/02 |

* cited by examiner

INFORMATION PROCESSING DEVICE, WORK SYSTEM, AND DETERMINATION METHOD

TECHNICAL FIELD

The present application relates to an information processing device or the like that determines a mounting position of a tape feeder to any one of multiple feeder mounting sections provided to a work machine.

BACKGROUND ART

Patent Literature 1 below describes a tape feeder which is detachably mounted on a feeder mounting section formed in a work machine. In addition, in Patent Literature 2 below, it is described that a work head disposed in a work machine has multiple holding tools, and multiple components are held by multiple holding tools.

PATENT LITERATURE

Patent Literature 1: JP-A-2017-188608
Patent Literature 2: WO 2014/010084

BRIEF SUMMARY

Technical Problem

The problem is to hold components appropriately from two or more tape feeders by two or more holding tools.

Solution to Problem

In order to solve the above problems, the present specification discloses an information processing device configured to determine a mounting position of a tape feeder to any one of multiple feeder mounting sections formed in a work machine, in which mounting positions of two or more tape feeders configured to supply components of holding target held by two or more holding tools of a work head disposed in the work machine are determined to any one of the multiple feeder mounting sections based on position information indicating supply positions of the two or more tape feeders, so that a difference in an amount of deviation of the supply positions of the two or more tape feeders is within a predetermined range.

In addition, the present specification discloses a work system including multiple feeder mounting sections capable of mounting a tape feeder; a work head having two or more holding tools; and a control device, in which the control device determines mounting positions of two or more tape feeders configured to supply components of holding target held by the two or more holding tools to any one of the multiple feeder mounting sections based on position information indicating supply positions of the two or more tape feeders, so that a difference in an amount of deviation of the supply positions of the two or more tape feeders is within a predetermined range.

In addition, the present specification discloses a determination method of determining a mounting position of a tape feeder to any one of multiple feeder mounting sections formed in a work machine, the method including determining mounting positions of two or more tape feeders configured to supply components of holding target held by two or more holding tools of a work head disposed in the work machine to any one of the multiple feeder mounting sections based on position information indicating supply positions of the two or more tape feeders, so that a difference in an amount of deviation of the supply positions of the two or more tape feeders is within a predetermined range.

Advantageous Effects

According to the present disclosure, the mounting positions of the two or more tape feeders are determined so that the difference in the amount of deviation of the supply positions of the two or more tape feeders is within the predetermined range. As a result, the components from the two or more tape feeders can be appropriately held by the two or more holding tools.

DESCRIPTION OF EMBODIMENTS

Hereinafter, as exemplary embodiments of the present disclosure, an example of the present disclosure will be described in detail with reference to the drawings.

(A) Configuration of Electronic Component Mounting Device

Figure 1:
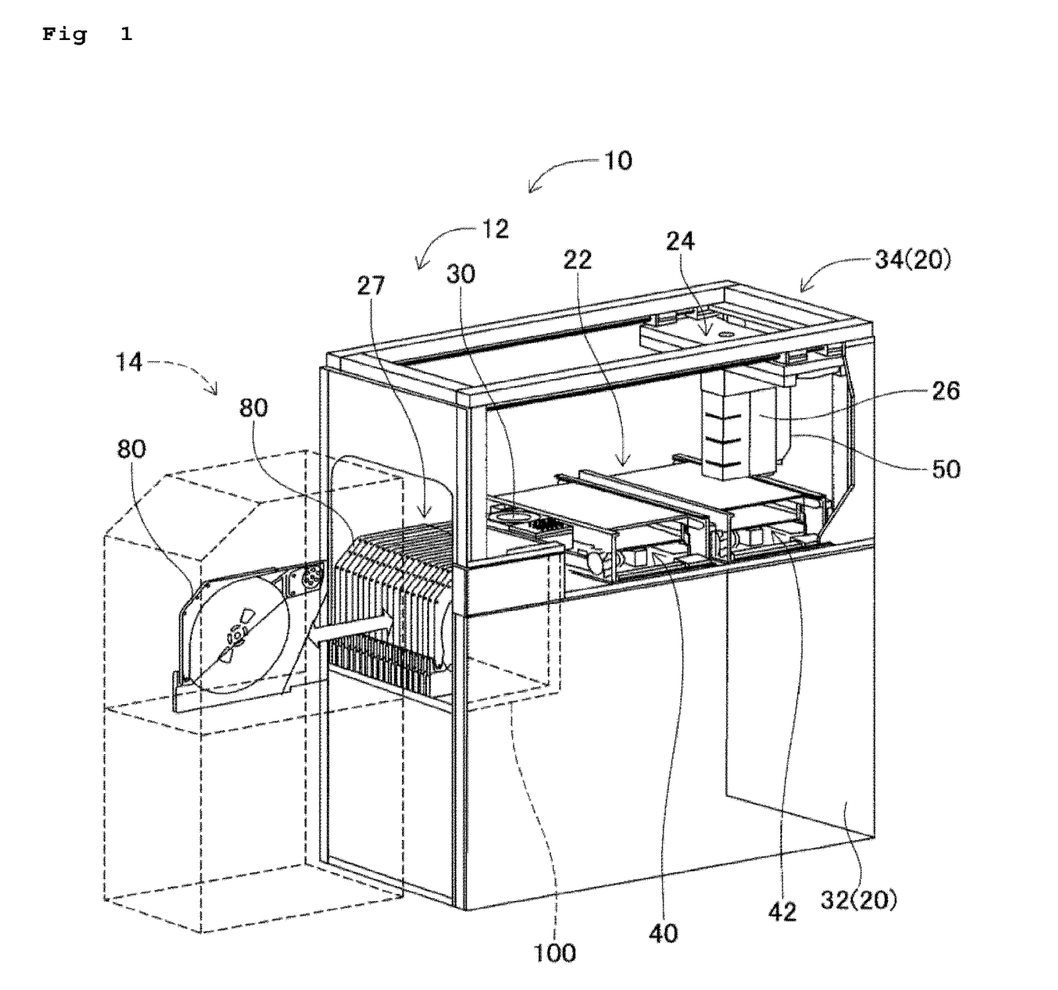
FIG. 1 is a perspective view illustrating an electronic component mounting system.

FIG. 1 illustrates electronic component mounting system 10. Electronic component mounting system 10 is provided with mounting work machine 12, loader 14 and control device (refer to FIG. 5) 16.

Mounting work machine 12 is provided with mounting machine main body 20, conveyance device 22, mounting head moving device (hereinafter, abbreviated as "moving device") 24, mounting head 26, supply device 27, mark camera (refer to FIG. 5) 28, and part camera 30. Mounting machine main body 20 includes frame section 32, and beam section 34 overlaid on frame section 32.

Conveyance device 22 is provided with two conveyor devices 40 and 42. These two conveyor devices 40 and 42 are parallel to each other, and are disposed on frame section 32 so as to extend in a predetermined direction. An extending direction of conveyor device 40 and 42 is referred to as the X-axis direction, and a horizontal direction perpendicular to the direction is referred to as the Y-axis direction. Each of two conveyor devices 40 and 42 conveys a circuit board supported by each conveyor device 40 and 42 by electromagnetic motor (refer to FIG. 5) 46 in the X-axis direction. In addition, the circuit board is held by board holding device (refer to FIG. 5) 48 at a predetermined position.

Moving device 24 is an XY-robot type moving device. Moving device 24 is provided with electromagnetic motor (refer to FIG. 5) 52 for sliding slider 50 in the X-axis direction, and electromagnetic motor (refer to FIG. 5) 54 for sliding slider 50 in the Y-axis direction. Slider 50 is attached to mounting head 26, and mounting head 26 is moved to any position on frame section 32 by operation of two electromagnetic motors 52 and 54.

Figure 2:
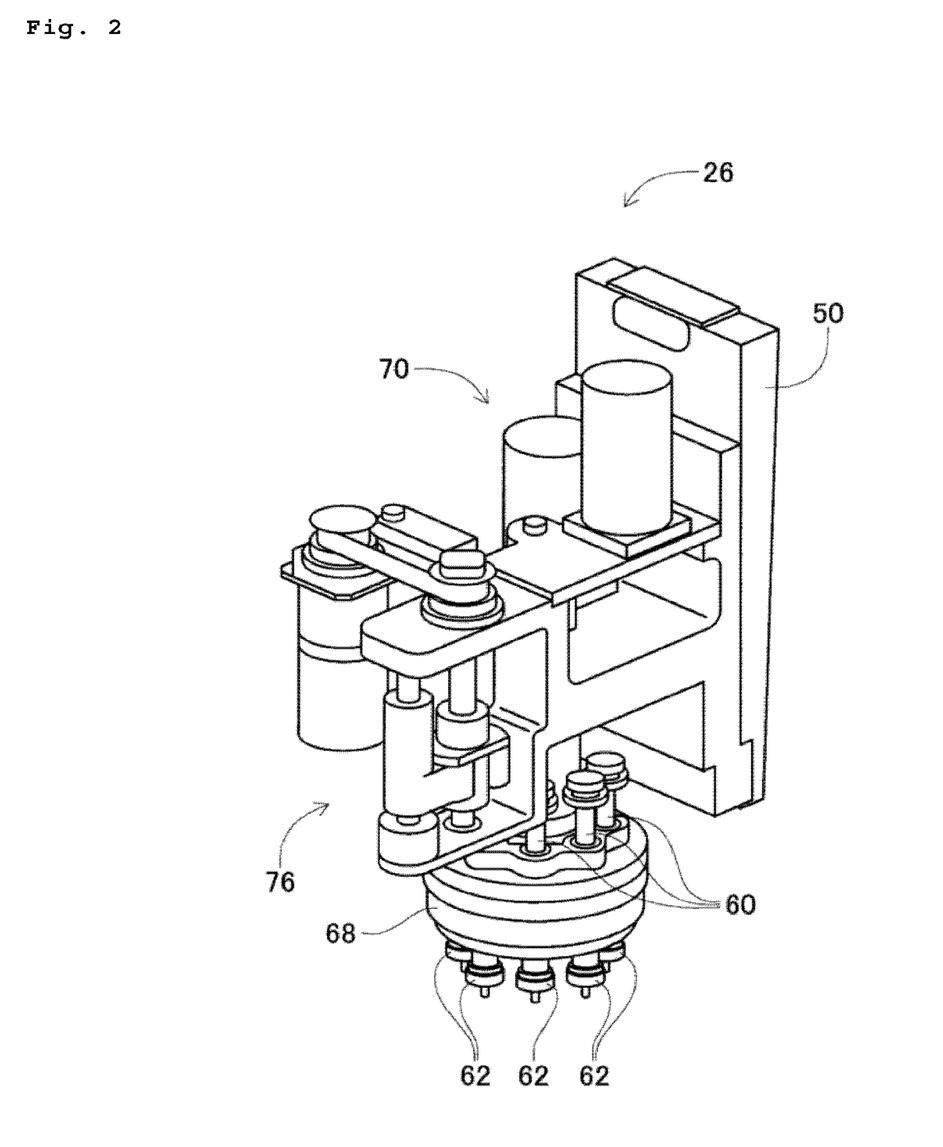
FIG. 2 is a perspective view illustrating a mounting head.

Mounting head 26 is a head for mounting the components on the circuit board. Mounting head 26, as illustrated in FIG. 2, is provided with eight rod-shaped mounting unit 60, suction nozzle 62 is mounted on a distal end section of each of eight mounting units 60. In FIG. 2, mounting head 26 in a state of being removed of the cover is illustrated.

Figure 3:
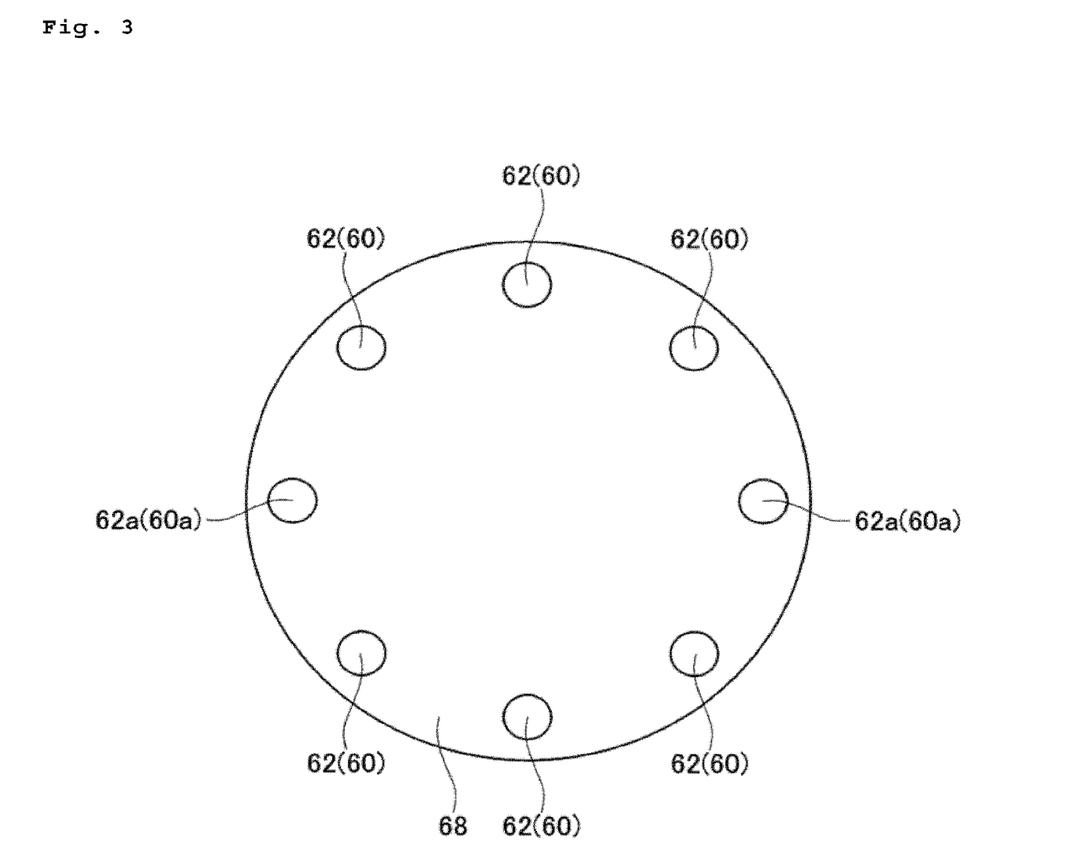
FIG. 3 is a view illustrating the mounting head from a viewpoint from below.

Suction nozzle 62 communicates with positive and negative pressure supply device (refer to FIG. 5) 66 via a negative pressure air and a positive pressure air passage. Suction nozzle 62 picks up and holds the component by negative pressure, and separates the held component by positive pressure. In addition, eight mounting units 60 are held on an outer peripheral portion of unit holding body 68 at an equal angle pitch in a state where the axial direction is perpendicular, and suction nozzle 62 extends downward from a lower surface of unit holding body 68. As a result, as illustrated in FIG. 3, suction nozzles 62 are arranged at eight equal positions. FIG. 3 is a view illustrating mounting head 26 from a viewpoint from below.

In addition, unit holding body 68, as illustrated in FIG. 2, intermittently rotates for each arrangement angle of mounting unit 60 by electromagnetic motor (refer to FIG. 5) 72 of holding body rotating device 70. In addition, two stop positions of the stop positions of multiple mounting units 60 are lifting and lowering stations, and two mounting units 60 stopped at two lifting and lowering stations are lifted and lowered by electromagnetic motor (refer to FIG. 5) 78 of unit lifting and lowering device 76. Two lifting and lowering stations are positioned symmetrically across the center of unit holding body 68. Mounting units 60 positioned at these two lifting and lowering stations may be referred to as lifting and lowering units 60a (refer to FIG. 3), and suction nozzles 62 mounted on lifting and lowering units 60a may be referred to as lifting and lowering nozzles 62a (refer to FIG. 3).

In addition, supply device 27, as illustrated in FIG. 1, is a feeder type supply device, and has multiple tape feeders 80. Tape feeder 80 accommodates a taped component in a wound state. The taped component is a component in which an electronic component is taped. Tape feeder 80 feeds the taped component by feeding device (refer to FIG. 5) 82. As a result, feeder type supply device 27 supplies the electronic component in the supply position by feeding the taped component.

Figure 4:
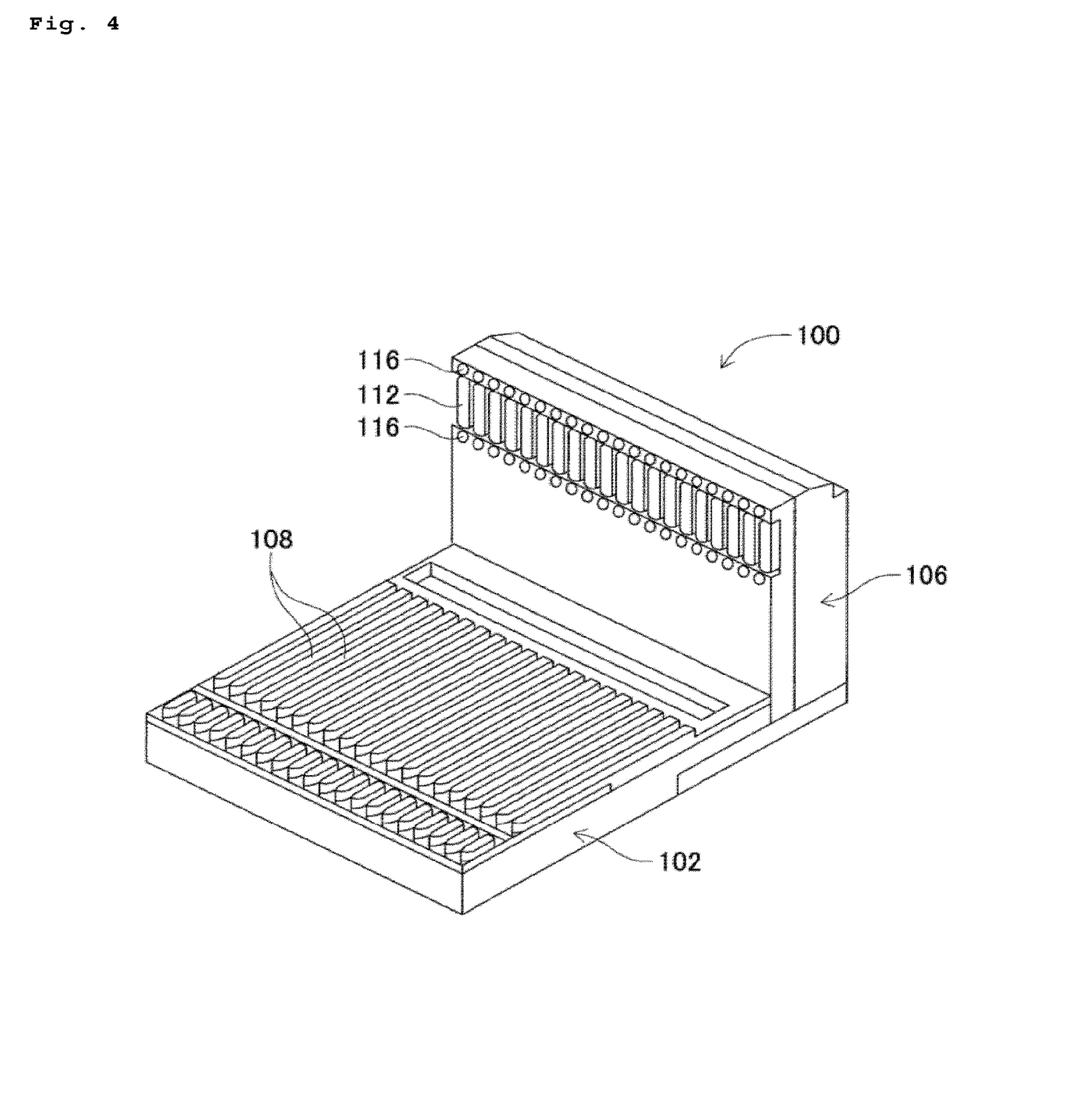
FIG. 4 is a perspective view illustrating a tape feeder holding stand.

In addition, tape feeder 80 is detachably mounted on tape feeder holding stand 100 which is fixedly provided at an end section on the front side of frame section 32. Specifically, tape feeder holding stand 100, as illustrated in FIG. 4, includes slide section 102 and erected section 106, slide section 102 is disposed on the upper surface of frame section 32, and erected section 106 is erected on the end section on the side close to conveyance device 22 of slide section 102.

Multiple slide grooves 108 are formed in slide section 102 so as to extend in the Y-axis direction. By fitting a lower edge portion of tape feeder 80 into slide groove 108, it is possible to slide tape feeder 80 in a direction approaching or separating from erected section 106 on the upper surface of slide section 102. In addition, connector connection section 112 is provided on erected section 106. On the other hand, a connector (not illustrated) is provided on a front end surface of tape feeder 80. By sliding in a direction to approach erected section 106 in a state of fitting tape feeder 80 into slide groove 108, the connector is connected to connector connection section 112.

In addition, a pair of fitting holes 116 is formed in erected section 106 of tape feeder holding stand 100 so as to sandwich connector connection section 112 in the vertical direction. On the other hand, a pair of erected pins (not illustrated) is provided on the front end surface of tape feeder 80 so as to sandwich the connector in the vertical direction. As a result, when the connector of tape feeder 80 is connected to connector connection section 112 of tape feeder holding stand 100, a pair of erected pins is fitted into a pair of fitting holes 116. As a result, tape feeder 80 is positioned in tape feeder holding stand 100.

Tape feeder 80 has memory (refer to FIG. 5) 118. Tape feeder 80 is mounted on tape feeder holding stand 100 and the connector of tape feeder 80 is connected to connector connection section 112 of tape feeder holding stand 100. Therefore, various types of information stored in memory 118 is transmitted to control device 16.

In addition, mark camera 28 is fixed in a state of facing downward to slider 50 of moving device 24, and moves to any position by the operation of moving device 24. As a result, mark camera 28 images any position of frame section 32. In addition, part camera 30 is disposed in a state of facing upward between conveyance device 22 and supply device 27 on the upper surface of frame section 32. As a result, part camera 30 images such components held in suction nozzle 62 mounted on mounting head 26.

In addition, loader 14 is a device that automatically mounts tape feeder 80 to tape feeder holding stand 100 and removes tape feeder 80 from tape feeder holding stand 100, and is disposed so as to face supply device 27. Since loader 14 is described in detail in WO 2014/010083 already filed by the applicant, loader 14 will be briefly described below.

Loader 14 has exchange device (refer to FIG. 5) 120, exchange device 120 grips tape feeder 80 accommodated in loader 14. Tape feeder 80 gripped by exchange device 120 is fitted into empty slide groove 108 and slides forward. As a result, tape feeder 80 accommodated in loader 14 is mounted on tape feeder holding stand 100. On the other hand, tape feeder 80 mounted on tape feeder holding stand 100 is gripped by exchange device 120 and slides rearward. As a result, tape feeder 80 is removed from tape feeder holding stand 100 and accommodated in loader 14.

Figure 5:
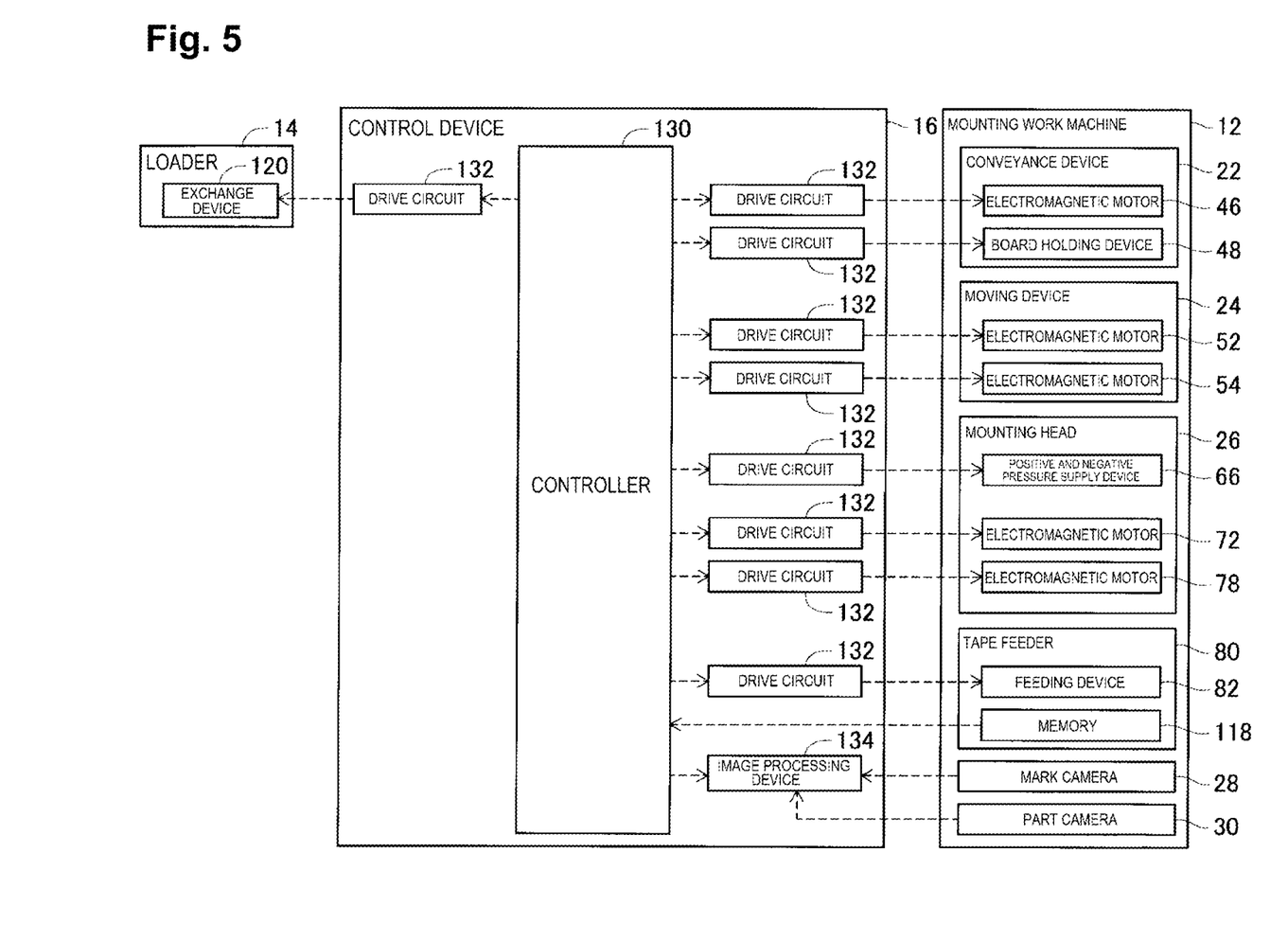
FIG. 5 is a block diagram illustrating a control device.

In addition, control device 16, as illustrated in FIG. 5, is provided with controller 130, multiple drive circuits 132, and image processing device 134. Multiple drive circuits 132, electromagnetic motor 46, 52, 54, 72, 78 of mounting work machine 12, board holding device 48, positive and negative pressure supply device 66, feeding device 82, and is connected to exchange device 120 of loader 14. Controller 130 is provided with CPU, ROM, RAM, and the like, mainly includes a computer, and is connected to multiple drive circuits 132. As a result, the operation of mounting work machine 12 and loader 14 is controlled by controller 130. In addition, controller 130 is also connected to image processing device 134. Image processing device 134 is a device for processing the captured data captured by mark camera 28 and part camera 30. As a result, controller 130 acquires various types of information from the captured data. Furthermore, controller 130 is also connected to memory 118 of tape feeder 80. As a result, controller 130 acquires information on tape feeder 80 from tape feeder 80.

(B) Mounting Work by Mounting Work Machine

In mounting work machine 12, it is possible to perform the mounting work on the circuit board held by conveyance device 22 by mounting head 26 by the configuration described above. Specifically, the circuit board is conveyed to the work position by a command of controller 130, and the circuit board is fixedly held by board holding device 48 at that position. Next, mark camera 28 moves above the circuit board to image the circuit board by a command of controller 130. As a result, information on the holding position of the circuit board and the like can be obtained.

In addition, tape feeder 80 feeds the taped component and supplies the electronic component at the supply position by a command of controller 130.

Mounting head 26 moves above the supply position of the electronic component by a command of controller 130, and suction nozzle 62 picks up and holds the electronic component. Suction nozzle 62 for holding the electronic component is suction nozzle 62 of mounting unit 60 positioned on first lifting and lowering nozzle of the two lifting and lowering stations. That is, first lifting and lowering nozzle 62a of two lifting and lowering nozzles 62a is lowered by the operation of electromagnetic motor 78, and picks up and holds the electronic component.

Subsequently, the holding of the electronic component by lifting and lowering nozzle 62a is completed, lifting and lowering nozzle 62a is raised, and thereafter mounting head 26 is moved above part camera 30. At this time, the electronic component held by lifting and lowering nozzle 62a is captured by part camera 30. As a result, information on the holding position of the component and the like can be obtained. Mounting head 26 is moved above the circuit board, and mounts the electronic component on the circuit board based on the holding position of the circuit board, the holding position of the electronic component, and the like. That is, the operation of moving device 24 is controlled based on the holding position of the circuit board, the holding position of the electronic component, and the like, and lifting and lowering nozzle 62a for holding the electronic component is lowered, so that the electronic component held by lifting and lowering nozzle 62a is mounted on the circuit board.

(C) Mounting Work of Tape Feeder by Loader

As described above, in mounting work machine 12, the electronic component is held from supply device 27 by suction nozzle 62 of mounting head 26, and the held electronic component is mounted on the circuit board. In addition, since eight suction nozzles 62 are disposed in mounting head 26, the eight electronic components may be mounted on the circuit board after the eight electronic components are held by eight suction nozzles 62 in supply device 27. As described above, by mounting the eight electronic components on the circuit board after eight electronic components are held by eight suction nozzles 62, the number of movements of mounting head 26 between supply device 27 and the circuit board can be reduced, and the cycle time can be shortened.

In addition, in the conventional mounting work machine, the electronic component is picked up and held from tape feeder 80 of supply device 27 for each suction nozzle 62. That is, one mounting unit 60 positioned in one lifting and lowering station is lowered, suction nozzle 62 of mounting unit 60 holds the electronic component at the supply position of tape feeder 80. Next, when the holding of the electronic component by suction nozzle 62 is completed, unit holding body 68 rotates in mounting head 26. As a result, mounting unit 60 different from mounting unit 60 on which suction nozzle 62 holding the electronic components is mounted moves to the lifting and lowering station. Mounting unit 60 newly moved to the lifting and lowering station is lowered, suction nozzle 62 of mounting unit 60 holds the electronic component at the supply position of tape feeder 80. As described above, the holding of the electronic component by one suction nozzle 62 and the rotation of unit holding body 68 are repeated, so that eight suction nozzles 62 hold the eight electronic components in mounting head 26.

However, when the electronic component is held from tape feeder 80 for each suction nozzle 62, the time required for holding work of the electronic component is increased, and the production efficiency is poor. Therefore, it is desired that the holding work of the electronic component is performed simultaneously in two suction nozzles 62. That is, it is desired that two mounting units 60 are simultaneously lowered and the two electronic components are simultaneously held by suction nozzles 62 mounted on two mounting units 60.

Figure 6:
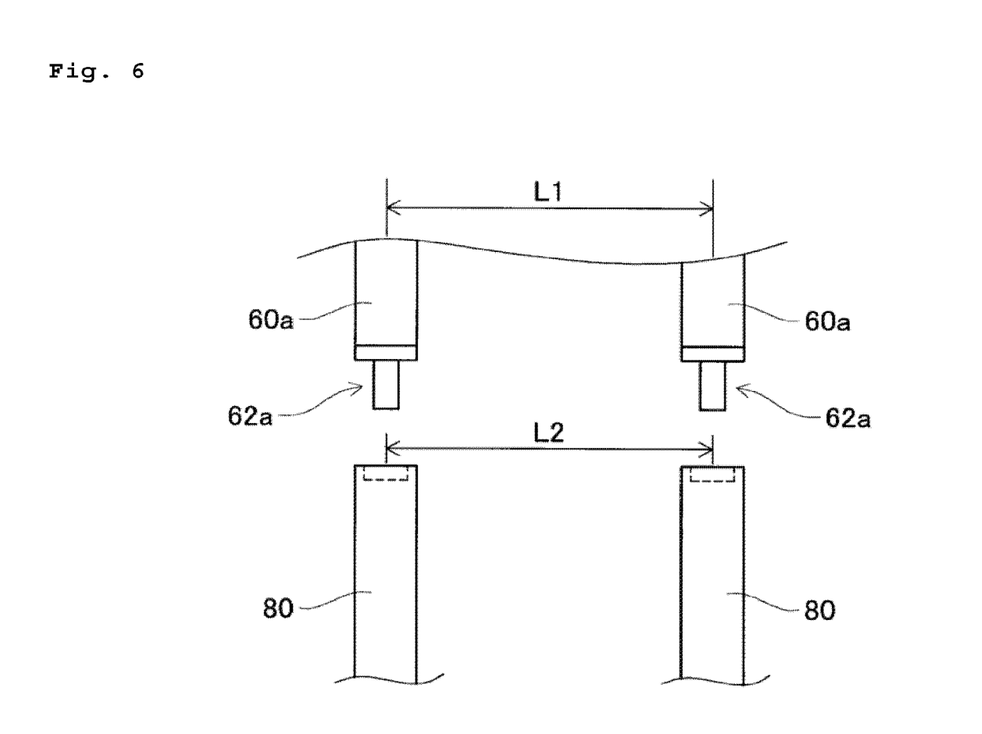
FIG. 6 is a schematic diagram illustrating two tape feeders in which components are held simultaneously by two suction nozzles.

Therefore, in mounting work machine 12, distance between two suction nozzles 62 (hereinafter, referred to as "distance between nozzles") L1 (refer to FIG. 6) and distance between the supply positions of two tape feeders 80 (hereinafter, referred to as "distance between the supply positions") L2 (refer to FIG. 6) are the same as each other. Distance between nozzles L1 is the distance between two mounting units 60 positioned in the two lifting and lowering stations, that is, two lifting and lowering nozzles 62a mounted on two lifting and lowering units 60a. In addition, supply position distance L2 is the distance between the supply positions of two tape feeder 80 for supplying the electronic component of holding target by two lifting and lowering nozzles 62a.

Figure 7:
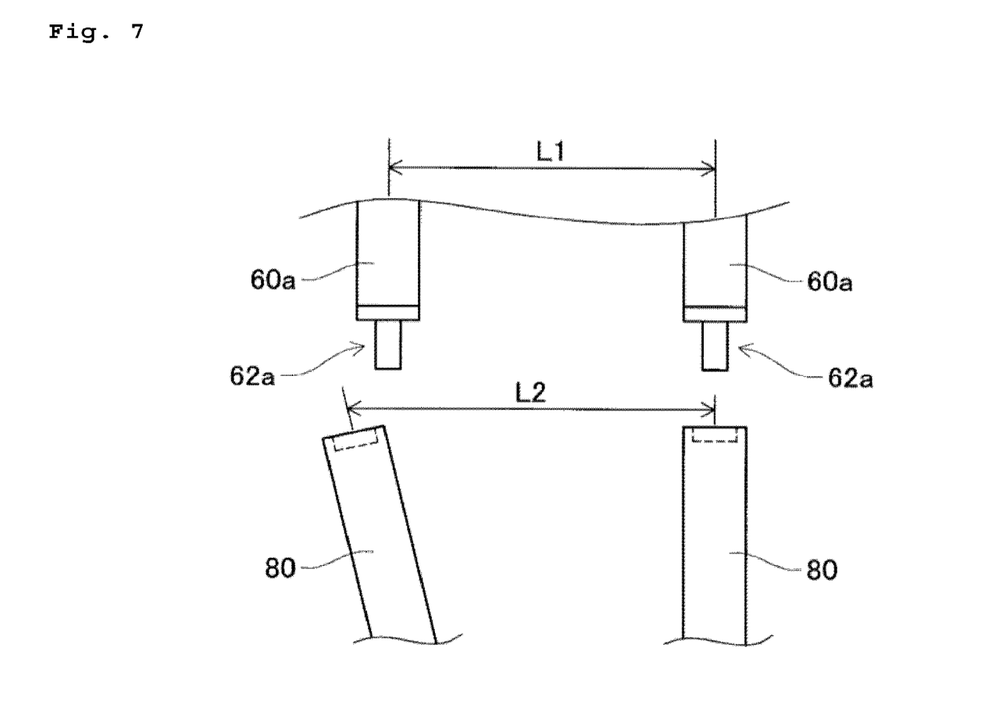
FIG. 7 is a schematic diagram illustrating two tape feeders in which components are held simultaneously by two suction nozzles.

As a result, it is likely to simultaneously perform the holding work of the electronic component in two lifting and lowering nozzles 62a, and it may not be simultaneously performed the holding work of the electronic component in two lifting and lowering nozzles 62a due to the deviation of the supply position of tape feeder 80. Specifically, for example, when tape feeder 80 is mounted on tape feeder holding stand 100, tape feeder 80 is inclined, and the supply position of tape feeder 80 may be deviated. In such a case, as illustrated in FIG. 7, distance between nozzles L1 and supply position distance L2 are different from each other, and there is a possibility that the holding work of the electronic component cannot be simultaneously performed in two lifting and lowering nozzles 62a. In addition, since distance between nozzles L1 may not be constant due to the mechanical tolerance in mounting head 26, distance between nozzles L1 and supply position distance L2 are different from each other, and there is a possibility that the holding work of the electronic component cannot be simultaneously performed in two lifting and lowering nozzles 62a. In particular, the smaller the electronic component of holding target, the higher the possibility that the holding work of the electronic component cannot be simultaneously performed in two lifting and lowering nozzles 62a, even when the difference between distance between nozzles L1 and supply position distance L2 is small. In addition, even when the holding work of the electronic component can be simultaneously performed in two lifting and lowering nozzles 62a, since the holding position of the electronic component by lifting and lowering nozzle 62a is deviated, appropriate mounting work is not ensured.

As described above, tape feeder 80 is positioned by a pair of erected pins and a pair of fitting holes 116. However, positioning in the lateral direction of tape feeder 80 is performed by first erected pin of the pair of erected pins and first fitting hole of the pair of fitting holes 116, and positioning in the vertical direction of tape feeder 80 is performed by second erected pin of the pair of erected pins and second fitting hole of the pair of fitting holes 116. That is, the positioning in the lateral direction is performed by one erected pin is fitted into one fitting hole 116 in tape feeder 80. Therefore, tape feeder 80 may be inclined, even when tape feeder 80 is positioned by the erected pin and fitting hole 116.

In addition, in order to make supply position distance L2 the same as distance between nozzles L1 with substantially no error, it is necessary to very accurately manufacture tape feeder 80 and the like, the manufacturing cost is increased. Therefore, a tolerance is set for the manufacture of tape feeder 80 and the like, and it is allowed to manufacture within the tolerance. Therefore, when manufacturing tape feeder 80, the supply position of tape feeder 80 may be deviated within the range of tolerances.

Therefore, before tape feeder 80 is manufactured and shipped, information on the supply position (hereinafter referred to as "pre-shipment position information") is calculated and stored in memory 118 of tape feeder 80. In detail, when tape feeder 80 is manufactured, a metal tape is set in tape feeder 80 in the same manner as the taped component in a stage before shipment. A mark is formed at a predetermined position of the metal tape. Tape feeder 80 in a state where the metal tape is set is mounted on the tape feeder holding stand having the same structure as tape feeder holding stand 100.

The metal tape set in tape feeder 80 is captured by the imaging device (not illustrated). At this time, a reference mark formed on tape feeder 80, and a mark formed on the metal tape are captured. The pre-shipment position information is calculated based on the captured data obtained by the imaging. That is, the pre-shipment position information indicating the amount of deviation between the supply position of tape feeder 80 and the reference supply position set in advance is calculated based on the amount of deviation in relative position between the reference mark formed on tape feeder 80 and the mark formed on the metal tape. The pre-shipment position information includes a distance between the supply position and the reference supply position of tape feeder 80, and a direction toward the supply position of tape feeder 80 from the reference supply position (deviation direction). Specifically, for example, information indicating that the X-Y coordinates are deviated by 1 mm in a predetermined direction is included. When the pre-shipment position information is calculated, the pre-shipment position information is stored in memory 118, and tape feeder 80 is shipped.

Tape feeder 80 is shipped, when tape feeder 80 is received in the plant introducing electronic component mounting system 10, tape feeder 80 is mounted on tape feeder holding stand 100 in mounting work machine 12 of electronic component mounting system 10. At this time, the pre-shipment position information stored in memory 118 of tape feeder 80 is transmitted to controller 130 of control device 16, and the identification information for identifying tape feeder 80 and the pre-shipment position information are stored in association with each other in controller 130. Therefore, for each of multiple tape feeder 80 mounted on tape feeder holding stand 100 of mounting work machine 12, the identification information of tape feeder 80 and the pre-shipment position information is stored in association with each other in controller 130.

Controller 130 determines the mounting positions of two tape feeders 80 for supplying the electronic component of holding target by two lifting and lowering nozzles 62a based on the pre-shipment position information stored in controller 130. At this time, controller 130 determines the mounting positions of two tape feeders 80, so that the amount of deviation between the supply positions of two tape feeder 80 for supplying the electronic component of holding target by two lifting and lowering nozzles 62a is the same.

Specifically, it is assumed that the pre-shipment position information of first tape feeder 80 is information indicating that first tape feeder 80 is deviated by 3 mm in a predetermined direction, for example, the R direction, and the pre-shipment position information of second tape feeder 80 is information indicating that there is substantially no deviation in any direction. In addition, it is assumed that the pre-shipment position information of third tape feeder 80 is information indicating that third tape feeder 80 is deviated by 3 mm in the R direction, similarly to the pre-shipment position information of first tape feeder 80. In such a case, when the mounting position of first tape feeder 80 is determined to be a position where the electronic component can be supplied to first lifting and lowering nozzle of two lifting and lowering nozzles 62a, and the mounting position of second tape feeder 80 is determined to be a position where the electronic component can be supplied to second lifting and lowering nozzle of two lifting and lowering nozzles 62a, distance between nozzles L1 and supply position distance L2 are different from each other, as illustrated in FIG. 7.

Figure 8:
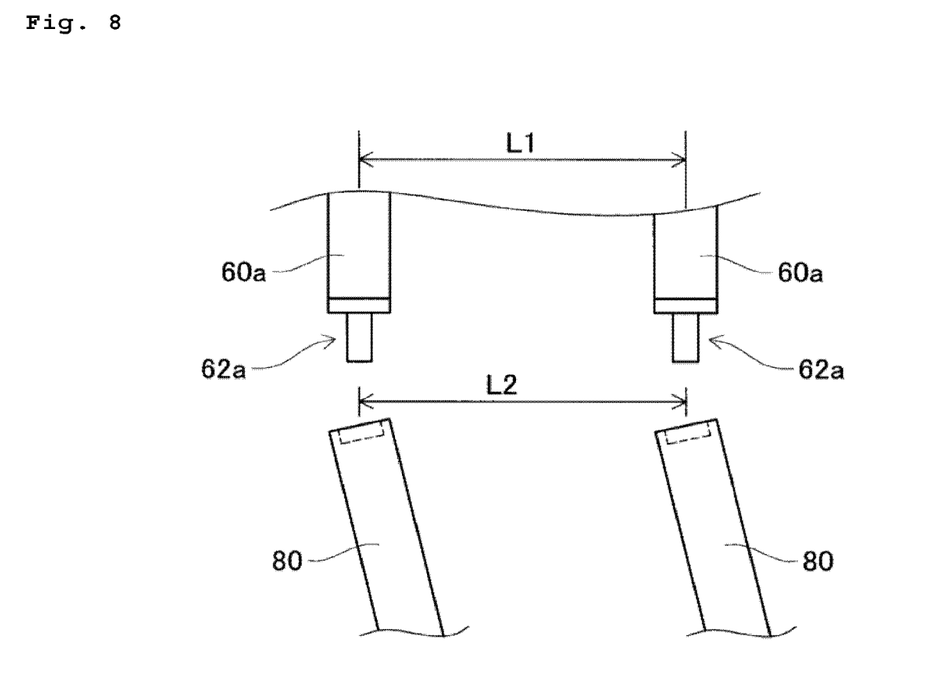
FIG. 8 is a schematic diagram illustrating two tape feeders in which components are held simultaneously by two suction nozzles.

On the other hand, when the mounting position of first tape feeder 80 is determined to be a position where the electronic component can be supplied to first lifting and lowering nozzle of two lifting and lowering nozzles 62a, and the mounting position of third tape feeder 80 is determined to be a position where the electronic component can be supplied to second lifting and lowering nozzle of two lifting and lowering nozzles 62a, distance between nozzles L1 and supply position distance L2 are the same as each other, as illustrated in FIG. 8. In other words, first tape feeder 80 is determined as a device for supplying an electronic component to first lifting and lowering nozzle of two lifting and lowering nozzles 62a, and third tape feeder 80 is determined as a device for supplying an electronic component to second lifting and lowering nozzle of two lifting and lowering nozzles 62a, so that distance between nozzles L1 and supply position distance L2 are the same as each other.

That is, by determining the mounting positions of two tape feeders 80 for supplying the electronic component of holding target by two lifting and lowering nozzles 62a so that the amount of deviation of the supply positions of two tape feeders 80 are the same as each other, distance between nozzles L1 and supply position distance L2 is the same as each other. Therefore, when the mounting positions of two tape feeders 80 for supplying the electronic component of holding target by two lifting and lowering nozzles 62a are determined by the method described above, controller 130 controls the operation of exchange device 120 of loader 14 based on the determined mounting positions.

Therefore, in tape feeder holding stand 100, as illustrated in FIG. 8, first tape feeder 80 is mounted on a position where the electronic component can be supplied to first lifting and lowering nozzle of two lifting and lowering nozzles 62a, and third tape feeder 80 is mounted on a position where the electronic component can be supplied to second lifting and lowering nozzle of two lifting and lowering nozzles 62a. As a result, in two lifting and lowering nozzles 62a, it is possible to simultaneously perform the holding work of the electronic component. In addition, in two lifting and lowering nozzles 62a, when the holding work of the electronic component is simultaneously performed, it is possible to suppress the deviation of the holding position of the electronic component by lifting and lowering nozzle 62a and ensure an appropriate mounting work. The mounting work of tape feeder 80 is performed as a setup work. That is, before performing the mounting work of the electronic component by mounting work machine 12 is performed, tape feeder 80 is mounted on tape feeder holding stand 100 by loader 14.

In the above description, although the mounting position of tape feeder 80 is determined so that the amount of deviation of the supply positions of two tape feeders 80 coincide with each other, the mounting position of tape feeder 80 may be determined so that the difference in the amount of deviation of the supply positions of two tape feeders 80 is reduced. That is, the concept of "so that the amount of deviation of the supply positions of two tape feeders 80 is the same as each other" includes not only the concept of "the amount of deviation of the supply positions of two tape feeders 80 coincide with each other" but also the concept of "so that the difference in the amount of deviation of the supply positions of two tape feeders 80 is reduced". Therefore, the mounting position of tape feeder 80 may be determined, so that the difference in the amount of deviation of the supply positions of two tape feeders 80 is within a predetermined range. In addition, in the pre-shipment position information stored in controller 130, there may be no combination in which the difference in the amount of deviation of the supply positions of two tape feeder 80 is within a predetermined range. In such a case, controller 130 displays an error screen on the display panel (not illustrated). As a result, it is possible to request some improvement to the worker. The threshold value is changed in accordance with the size of the component of supply target.

In addition, as described above, the pre-shipment position information is information obtained before tape feeder 80 is shipped, and there is a possibility that the amount of deviation of the supply position of tape feeder 80 mounted on tape feeder holding stand 100 of mounting work machine 12 is not appropriately reflected. That is, the pre-shipment position information is information of tape feeder 80 in a state of being mounted on the tape feeder holding stand having the same structure as that of tape feeder holding stand 100, and is not information of tape feeder 80 mounted on tape feeder holding stand 100 of mounting work machine 12. Therefore, there is a possibility that the amount of deviation of the supply position of tape feeder 80 mounted on tape feeder holding stand 100 of mounting work machine 12 may differ from the amount of deviation included in the pre-shipment position information.

Therefore, in mounting work machine 12, the amount of deviation of the supply position of tape feeder 80 is calculated during the mounting work of the electronic component, and the information on the supply position including the calculated amount of deviation (hereinafter, referred to as "working position information") is stored in controller 130. The mounting position of two tape feeder 80 for supplying the electronic component of holding target by two lifting and lowering nozzles 62a is determined based on the working position information stored in controller 130.

Specifically, in mounting work machine 12, as described above, the electronic component held by suction nozzle 62 is captured by part camera 30 during the mounting work, and controller 130 calculates the holding position of the electronic component by suction nozzle 62 based on the captured data. Therefore, controller 130 also calculates the amount of deviation of the supply position of tape feeder 80 by calculating the amount of deviation of the holding position of the electronic component by suction nozzle 62, based on the holding position of the electronic component by suction nozzle 62. Controller 130 stores the calculated amount of deviation of the supply position of tape feeder 80 as the working position information. At this time, controller 130 stores the working position information in association with the pre-shipment position information stored in advance.

When storing the working position information, controller 130 determines the mounting position of two tape feeder 80 for supplying the electronic component of holding target by two lifting and lowering nozzles 62a based on the working position information. Since the determination method of the mounting position of tape feeder 80 based on the working position information is the same as the determination method of the mounting position of tape feeder 80 based on the pre-shipment position information, the description of the determination method of the mounting position of tape feeder 80 based on the working position information will be omitted. As described above, by determining the mounting position of tape feeder 80 based on the working position information, even in a case where the amount of deviation of the supply position in mounting work machine 12 is different from that of the pre-shipment position information, the holding work by two lifting and lowering nozzles 62a can be appropriately performed.

In addition, when determining the mounting position of tape feeder 80 based on the working position information, controller 130 controls the operation of exchange device 120 of loader 14 based on the determined mounting position, and tape feeder 80 is mounted on tape feeder holding stand 100 by loader 14. In a case where the mounting position of tape feeder 80 is determined based on the working position information, the mounting work of tape feeder 80 may be performed not only before the mounting work of the electronic component but also during the mounting work of the electronic component. By performing the mounting work of tape feeder 80 during the mounting work of the electronic component, it is possible to increase the accuracy of the mounting work during the production of board.

In addition, when storing the working position information, controller 130 stores information indicating the type of the taped component (hereinafter, referred to as "taped component information") set in tape feeder 80 when calculating the information in association with the working position information. The taped component information includes information indicating a tape material. That is, the tape of the taped component includes a tape made of a paper material, a tape made of a resin material, and the like, and the taped component information includes information indicating the tape made of the paper material and the tape made of the resin material. Therefore, controller 130 distinguishes and stores the working position information in a case where the taped component information includes information indicating the tape made of the paper material and the working position information in a case where the taped component information includes information indicating the tape made of the resin material. This is because the amount of deviation of the supply position when the taped component of the tape made of the paper material is set in tape feeder 80, and the amount of deviation of the supply position when the taped component of the tape made of the resin material is set in tape feeder 80 are different from each other.

As described above, in controller 130, since the working position information is stored for each tape material of the taped component, the mounting position of tape feeder 80 is determined in consideration of the tape material of the taped component set in tape feeder 80. That is, in a case where the taped component set in tape feeder 80 is the tape made of the paper material, the mounting position of tape feeder 80 is calculated based on the working position information associated with the taped component information indicating the tape made of the paper material. In addition, in a case where the taped component set in tape feeder 80 is the tape made of the resin material, the mounting position of tape feeder 80 is calculated based on the working position information associated with the taped component information indicating the tape made of the resin material. As a result, even in a case where the supply position is changed in accordance with the taped component set in tape feeder 80, it is possible to appropriately perform the holding work by two lifting and lowering nozzles 62a.

In addition, the taped component information may include not only information indicating the material of the tape, but also information indicating the cavity pitch, information indicating the manufacturer and the manufacturing plant of the taped component, and the like. As a result, in consideration of the habit or the like of the taped component by the manufacturer and the manufacturing plant, it is possible to appropriately perform the holding work by lifting and lowering nozzle 62a.

Incidentally, in the above example, mounting work machine 12 is an example of a work system. Loader 14 is an example of a feeder mounting device. Control device 16 is an example of an information processing device and a control device. Mounting head 26 is an example of a work head. Part camera 30 is an example of an imaging device. Suction nozzle 62 is an example of a holding tool. Tape feeder 80 is an example of a tape feeder. Slide groove 108 is an example of a feeder mounting section. Memory 118 is an example of a storage section.

The present disclosure is not limited to the above example, and can be achieved in various aspects with various modifications and improvements based on the knowledge of those skilled in the art. Specifically, for example, in the above example, although the operation of loader 14 is controlled based on the mounting position of tape feeder 80 determined by controller 130, the mounting position of tape feeder 80 determined by controller 130 may be notified to the worker by a notification device such as a display panel. As a result, the worker can mount tape feeder 80 at the notified mounting position. That is, the mounting work of tape feeder 80 may be performed automatically using loader 14, or the worker may perform the mounting work of tape feeder 80.

In addition, In the above example, although the present disclosure is applied to the simultaneous holding of the electronic components by two suction nozzles 62, the present disclosure may be applied to the simultaneous holding of the electronic components by three or more suction nozzles 62. That is, in order to hold the electronic components simultaneously by three or more suction nozzles 62, the mounting position of tape feeder 80 for supplying the components of holding target by three or more suction nozzles 62 may be determined based on the pre-shipment position information or the working position information.

Regarding the simultaneous holding of the electronic components by multiple suction nozzles 62, the concept of "simultaneous" includes not only the concept of exactly the same timing, but also a concept having a certain temporal width. For example, an aspect in which the component is held by one suction nozzle 62 without moving mounting head 26 at the mounting position, that is, without moving mounting head 26 by moving device 24, and thereafter the component is held by another one suction nozzle 62 is also included in the simultaneous holding of the electronic component by multiple suction nozzles 62.

REFERENCE SIGNS LIST

12: mounting work machine (work system), 14: loader (feeder mounting device), 16: control device (information processing device), 26: mounting head (work head), 30: part camera (imaging device), 62: suction nozzle (holding tool), 80: tape feeder, 108: slide groove (feeder mounting section), 118: memory (storage section)

The invention claimed is:

1. An information processing device configured to a work machine comprising:
a controller connected to multiple drive circuits configured to
determine a first mounting position of a first tape feeder to a first feeder mounting section formed in the work machine,
determine a first working position of a component of the first tape feeder to a first holding tool of a work head based on the first mounting position of the first tape feeder and pre-shipment position information of the first tape feeder including a distance between a supply position of the first tape feeder and a reference supply position of the first tape feeder and a deviation of a direction toward the supply position of the first tape feeder from the reference supply position of the first tape feeder,
determine a second mounting position of a second tape feeder to a second feeder mounting section formed in the work machine,
determine a second working position of a component of the second tape feeder to a second holding tool of the work head based on the second mounting position of the second tape feeder and pre-shipment position information of the second tape feeder including a distance between a supply position of the second tape feeder and a reference supply position of the second tape feeder and a direction toward the supply position of the second tape feeder from the reference supply position of the second tape feeder,
determine a difference between the first working position and the second working position, and
when the difference between the first working position and the second working position is within a predetermined range, control the work head and the work machine so that the first holding tool holds the component of the first tape feeder and the second holding tool holds the component of the second tape feeder simultaneously.

2. The information processing device according to claim 1, wherein the first and second mounting positions of the first and second tape feeders determined by the information processing device are output to a notification device.

3. The information processing device according to claim 1, wherein
the tape feeder includes a storage section with a memory configured to store the pre-shipment position information.

4. The information processing device according to claim 3, wherein
the pre-shipment position information is information indicating a supply position of the tape feeder measured in advance.

5. The information processing device according to claim 1, wherein the working position information is information calculated based on captured data captured by an imaging device disposed in the work machine.

6. The information processing device according to claim 5, wherein
an image of a component held by the holding tool is captured by the imaging device and the working position information is calculated based on the image of the component.

7. The information processing device according to claim 1, wherein
the pre-shipment position information is stored in association with a type of a taped component.

8. A work system configured to determine a mounting position of a tape feeder in a work machine comprising:
a first feeder mounting section configured to mount a first tape feeder, and a second feeder mounting section configured to mount a second tape feeder;
a work head having first and second holding tools; and
a control device connected to multiple drive circuits, wherein
the control device is configured to
determine a first mounting position of the first tape feeder to the first feeder mounting section,
determine a first working position of a component of the first tape feeder to the first holding tool of the work head based on the first mounting position of the first tape feeder and pre-shipment position information of the first tape feeder including a distance between a supply position of the first tape feeder and a reference supply position of the first tape feeder and a deviation of a direction toward the supply position of the first tape feeder from the reference supply position of the first tape feeder,
determine a second mounting position of the second tape feeder to the second feeder mounting section,
determine a second working position of a component of the second tape feeder to the second holding tool of the work head based on the second mounting position of the second tape feeder and pre-shipment position information of the second tape feeder including a distance between a supply position of the second tape feeder and a reference supply position of the second tape feeder and a direction toward the supply position of the second tape feeder from the reference supply position of the second tape feeder,
determine a difference between the first working position and the second working position, and
when the difference between the first working position and the second working position is within a predetermined range, control the work head and the work machine so that the first holding tool holds the component of the first tape feeder and the second holding tool holds the component of the second tape feeder simultaneously.

9. An operating method for a work machine, the method comprising:
determining a first mounting position of a first tape feeder to a first feeder mounting section formed in a work machine,
determining a first working position of a component of the first tape feeder to a first holding tool of a work head based on the first mounting position of the first tape feeder and pre-shipment position information of the first tape feeder including a distance between a supply position of the first tape feeder and a reference supply position of the first tape feeder and a direction toward the supply position of the first tape feeder from the reference supply position of the first tape feeder,
determining a second mounting position of a second tape feeder to a second feeder mounting section formed in the work machine,
determining a second working position of a component of the second tape feeder to a second holding tool of the work head based on the second mounting position of the second tape feeder and pre-shipment position information of the second tape feeder including a distance between a supply position of the second tape feeder and a reference supply position of the second tape feeder and a deviation of a direction toward the supply position of the second tape feeder from the reference supply position of the second tape feeder,
determining a difference between the first working position and the second working position; and
when the difference between the first working position and the second working position is within a predetermined range, controlling the work head and the work machine so that the first holding tool holds the component of the first tape feeder and the second holding tool holds the component of the second tape feeder simultaneously.

* * * * *